(12) United States Patent
Waltari

(10) Patent No.: US 9,178,528 B1
(45) Date of Patent: Nov. 3, 2015

(54) CURRENT IMPULSE (CI) DIGITAL-TO-ANALOG CONVERTER (DAC)

(71) Applicant: IQ-Analog Corporation, San Diego, CA (US)

(72) Inventor: Mikko Waltari, Escondido, CA (US)

(73) Assignee: IQ-Analog Corporation, San Diego, CA (US)

( * ) Notice: Subject to any disclaimer, the term of this patent is extended or adjusted under 35 U.S.C. 154(b) by 0 days.

(21) Appl. No.: 14/750,203

(22) Filed: Jun. 25, 2015

Related U.S. Application Data

(63) Continuation-in-part of application No. 14/681,206, filed on Apr. 8, 2015, now Pat. No. 9,098,072, which is a continuation-in-part of application No. 14/656,880, filed on Mar. 13, 2015, which is a continuation of (Continued)

(51) Int. Cl.
*H03M 1/00* (2006.01)
*H03M 1/66* (2006.01)

(52) U.S. Cl.
CPC ................................. *H03M 1/66* (2013.01)

(58) Field of Classification Search
CPC .......... H03M 1/50; H03M 1/502; H03M 1/60; G04F 10/005
USPC ............................ 341/157, 166, 136, 144, 150
See application file for complete search history.

(56) References Cited

U.S. PATENT DOCUMENTS

| | | | |
|---|---|---|---|
| 6,476,748 B1 * | 11/2002 | Galton | .......................... 341/144 |
| 6,501,409 B1 | 12/2002 | Lynn et al. | |
| 6,778,121 B2 * | 8/2004 | Manganaro | ................... 341/150 |
| 7,312,737 B2 | 12/2007 | Jungerman et al. | |
| 7,355,543 B2 * | 4/2008 | Kwon-Chang et al. | ........ 341/150 |
| 7,561,089 B2 * | 7/2009 | Zare-Hoseini et al. | ....... 341/150 |

(Continued)

FOREIGN PATENT DOCUMENTS

CN     12006078     7/2012

OTHER PUBLICATIONS

H Huang et al., An 8-bit 100 GS/s Distributed DAC in 28-nm CMOS for Optical Communications, IEEE Transactions on Microwave Theory and Techniques, vol. 63, No. 4, Apr. 2015.

(Continued)

*Primary Examiner* — Khai M Nguyen
(74) *Attorney, Agent, or Firm* — Law Office of Gerald Maliszewski; Gerald Maliszewski

(57) ABSTRACT

A current impulse (CI) method is provided for converting digital data signals to analog values. First, digital data bits are converted into current impulses. Then, the current impulses are converted into analog currents representing the digital data bits. More typically, the method accepts a k-bit digital word, and converts the k-bit digital word into (k) corresponding current impulses. In one aspect, the method accepts (n) consecutive k-bit digital words. Then, for each bit position in the k-bit digital word, (n) consecutive bits are sampled using (n) consecutive phases of an n-phase clock, creating (n) interleaved current impulses. The (n) interleaved current impulses are converted into an analog current representing the (n) consecutive k-bit digital words. Alternatively, (n) consecutive bits are sampled using (n) consecutive phases of an n-phase clock for each bit position in the k-bit digital word, creating (n) summed current impulses. A CI digital-to-analog converter is also provided.

22 Claims, 12 Drawing Sheets

Related U.S. Application Data application No. 14/537,587, filed on Nov. 10, 2014, now Pat. No. 9,007,243, which is a continuation-in-part of application No. 14/531,371, filed on Nov. 3, 2014, now Pat. No. 9,030,340, which is a continuation-in-part of application No. 14/511,206, filed on Oct. 10, 2014, now Pat. No. 8,917,125, which is a continuation-in-part of application No. 14/081,568, filed on Nov. 15, 2013, now Pat. No. 8,878,577, which is a continuation-in-part of application No. 13/603,495, filed on Sep. 5, 2012, now Pat. No. 8,654,000, said application No. 14/537,587 is a continuation-in-part of application No. 14/158,299, filed on Jan. 17, 2014, now Pat. No. 9,019,137, and a continuation-in-part of application No. 14/489,582, filed on Sep. 18, 2014, now Pat. No. 8,928,513, said application No. 14/681,206 is a continuation-in-part of application No. 14/531,371, filed on Nov. 3, 2014, now Pat. No. 9,030,340.

(56) References Cited

U.S. PATENT DOCUMENTS

| | | | |
|---|---|---|---|
| 7,652,607 B2 * | 1/2010 | Edwards | 341/150 |
| 7,741,985 B2 * | 6/2010 | Kubota et al. | 341/150 |
| 8,106,803 B2 * | 1/2012 | Hurwitz et al. | 341/150 |
| 8,164,501 B2 | 4/2012 | Venes et al. | |
| 8,659,453 B1 | 2/2014 | Low et al. | |
| 8,773,296 B1 | 7/2014 | Dusatko et al. | |
| 2014/0327561 A1 | 11/2014 | Wloczysiak | |

OTHER PUBLICATIONS

A. Balteanu et al., A 6-bit Segmented RZ DAC Architecture with up to 50-GHz Sampling Clock and 4 Vpp Differential Swing, IEEE 2012.

* cited by examiner

CURRENT IMPULSE (CI) DIGITAL-TO-ANALOG CONVERTER (DAC)

RELATED APPLICATIONS

The application is a Continuation-in-part of an application entitled, TRAVELING PULSE WAVE QUANTIZER, invented by Mikko Waltari, Ser. No. 14/681,206, filed Apr. 8, 2015;

which is a Continuation of an application entitled, CUSTOMIZED DATA CONVERTERS, invented by Mike Kappes, Ser. No. 14/656,880, filed Mar. 13, 2015;

which is a Continuation of an application entitled, SYSTEM AND METHOD FOR CUSTOMIZING DATA CONVERTERS FROM UNIVERSAL FUNCTION DICE, invented by Mike Kappes, Ser. No. 14/537,587, filed Nov. 10, 2014, now U.S. Pat. No. 9,007,243, issued on Apr. 14, 2015;

which is a Continuation-in-part of an application entitled, N-PATH INTERLEAVING ANALOG-TO-DIGITAL CONVERTER (ADC) WITH BACKGROUND CALIBRATION, invented by Mikko Waltari et al., Ser. No. 14/531,371, filed Nov. 3, 2014, now U.S. Pat. No. 9,030,340, issued on May 12, 2015;

which is a Continuation-in-part of an application entitled, INTERLEAVING ANALOG-TO-DIGITAL CONVERTER (ADC) WITH BACKGROUND CALIBRATION, invented by Mikko Waltari et al., Ser. No. 14/511,206, filed Oct. 10, 2014, now U.S. Pat. No. 8,971,125, issued Dec. 23, 2014;

which is a Continuation-in-part of an application entitled, SYSTEM AND METHOD FOR FREQUENCY MULTIPLIER JITTER CORRECTION, Ser. No. 14/081,568, filed Nov. 15, 2013, issued as U.S. Pat. No. 8,878,577 on Nov. 4, 2014;

which is a Continuation-in-Part of an application entitled, TIME-INTERLEAVED ANALOG-TO-DIGITAL CONVERTER FOR SIGNALS IN ANY NYQUIST ZONE, invented by Mikko Waltari, Ser. No. 13/603,495, filed Sep. 5, 2012, issued as U.S. Pat. No. 8,654,000 on Feb. 18, 2014.

Ser. No. 14/537,587 is a Continuation-in-part of an application entitled, MULTIPLYING DIGITAL-TO-ANALOG CONVERTER, invented by Waltari et al., Ser. No. 14/158,299, filed Jan. 17, 2014, now U.S. Pat. No. 9,019,137, issued on Apr. 28, 2015.

Ser. No. 14/537,587 is a Continuation-in-part of an application entitled, N-PATH INTERLEAVING ANALOG-TO-DIGITAL CONVERTER (ADC) WITH BACKGROUND CALIBRATION, invented by Mikko Waltari et al., Ser. No. 14/489,582, filed Sep. 18, 2014, now U.S. Pat. No. 8,928,513, issued on Jan. 6, 2015;

Ser. No. 14/681,206 is a Continuation-in-part of an application entitled, N-PATH INTERLEAVING ANALOG-TO-DIGITAL CONVERTER (ADC) WITH BACKGROUND CALIBRATION, invented by Mikko Waltari et al., Ser. No. 14/531,371, filed Nov. 3, 2014, now U.S. Pat. No. 9,030,340, issued on May 12, 2015. All these application are incorporated herein by reference.

BACKGROUND OF THE INVENTION

1. Field of the Invention

This invention generally relates to digital-to-analog converters (DACs) and, more particularly, to a current impulse DAC system and method.

2. Description of the Related Art

At the time of this writing the DACs with the widest signal bandwidth of greater than 50 gigasamples per second (GS/s) have been implemented using indium phosphorous (InP) or silicon germanium (SiGe) BiCMOS [1] technologies. While the availability of such heterojunction bipolar transistor (HBT) devices helps with the signal bandwidth, these technologies are not well suited for integration with other fast digital logic. Interfacing high speed digital data into the DAC is a major system level challenge, and bringing the DAC into the same CMOS die with the digital signal processing (DSP) blocks is also highly desirable. It has been shown [2] that the most advanced CMOS nodes are suitable for designing DACs with record braking update rates, but signal bandwidth and linearity remain a big challenge.

Time interleaving is a concept widely used in high speed analog-to-digital (A/D) converters (ADCs) to achieve a higher sampling rate than can be obtained using a single ADC core. The technique uses multiple slowly clocked ADCs that operate in parallel, and takes turns sampling the input and converting it to a digital value. With properly aligned sampling clock phases, the composite sampling rate is the sampling rate of the individual ADC core multiplied by the number of the cores used.

The same principle can be applied to DACs as well. The current steering DAC architecture, which is the most common choice in high speed applications, is inherently very fast and has conventionally been able to satisfy the needs of almost all applications. For that reason interleaving is not very widely used in DACs. Another important reason is that one cannot interleave just any kind of DAC because they need to have return-to-zero type output signals to provide the narrow signal pulses needed for interleaving. This means that although the update rate of the DAC core is relaxed due to interleaving, signals must be used with pulse widths similar to the clock period at the full rate.

FIG. 1A is a schematic depicting the general concept of an interleaved DAC, and FIG. 1B depicts associated waveforms (prior art). The waveforms show how four DACs generate quarter period long output pulses that are then added together to form the final composite output signal. The pulsed output signal of the DAC core goes to zero between the pulses, hence the name return-to-zero (RZ). This is necessary; as not zeroing the output would result in inter symbol interference, which manifests itself in the frequency domain as a sin(x)/x response with zeros at fs/N, where N is the number of the interleaved channels.

One of the known problems with the return-to-zero waveform is its jitter sensitivity. Any variation in the pulse width due to clock jitter is translated into an error in the output current. In the interleaving application some but not all jitter sources cancel out, making the situation somewhat better.

It can be argued that achieving a wide signal bandwidth is an even bigger challenge in very high speed DAC design than is realizing a faster update rate. The bandwidth is mainly limited by the capacitance at the output node. It is clear that interleaving, with many parallel DACs connected to the same output, simply increases the capacitance. Techniques such as adding a cascode stage after combining the currents, and design principles borrowed from distributed power amplifiers can be used alleviate the bandwidth issue [1,2]. However, keeping the interleaving factor low and having a DAC core with small output capacitance are both still essential.

FIG. 2 is a schematic depicting a simplified unit cell in a return-to-zero current steering DAC (prior art). The complete DAC consists of an array of these cells connected to the same outputs and controlled with different data bits. The cell has a current source, sized according to the weight of the data bit, followed by a data switch controlled by the data bit and its complement. The switch steers the current either toward the positive or the negative output. A second level of switches, controlled with the clock, is placed between the data switch and the output. These clock switches create the RZ waveform by switching the current either to the load or to a dummy output.

The open loop architecture of the current steering DAC makes it simple and fast. It can directly drive resistive loads and can easily be adapted to deep submicron technologies. A known drawback of the architecture is the fact that its output impedance is signal dependent, as the number of current sources connected to each output changes with the digital input data. At high signal frequencies the capacitive part of the impedance dominates and is the main source of nonlinearity in the DAC.

The differential current switches in the DAC are operated in the saturation region of the transistor's IV curve. This provides isolation between the output and the current sources, and minimizes voltage variation in the common source node. One drawback, however, is that the switches require more voltage headroom, leaving less output signal range. This signal range issue is problematic in advanced technology nodes that use very low power supply voltages. The switch control voltages are not simple CMOS logic levels, but require a certain common mode level and a reduced voltage swing. This means that the switches need a special driver circuit, which often becomes the speed bottleneck in very high speed design. The size of the switch transistor should ideally be as small as possible to minimize its parasitic capacitances, but operation in saturation region with limited voltage headroom forces the use of fairly large switch transistors.

The current source in the current steering DAC is a transistor with its gate biased with a control voltage and the drain usually cascoded with another transistor. This current source is slow to turn on and off and thus the output current is steered in one of two ways instead of being turned on and off.

This is not the only way to implement a current source, though. A resistor can be used as a current source, for instance. Another way, which has some added benefits, is the use of a switched capacitor. A capacitor that is charged to voltage V during one clock phase and then discharged to ground during another, delivers a charge packet C*V in the form of a current impulse in every clock cycle. The average current is fclk*C*V, where fclk is the clock frequency and C the capacitance. What makes this very attractive for high sampling rate operation is that the current grows with the clock frequency, making it practical to implement currents in the range of tens of milliamps with capacitors of just few hundred femtofarads (fF).

FIG. 3 is a schematic depicting a switched capacitor DAC cell (prior art). Switched capacitor (SC) techniques are commonly used in the industry, but typically at much lower frequencies. Whether used in switch-cap filters, delta-sigma modulators, or pipelined ADCs, the switched capacitors are combined with operational amplifiers to provide a discrete-time voltage output. The switched capacitor alone doesn't make a practical current source. It needs a virtual ground to which the capacitor is discharged. Voltage mode SC circuits use opamps for this purpose.

It would be advantageous if a time-interleaved DAC could be realized that overcome the limitations of a current steering return-to-zero DAC, using a fast open loop architecture with a current mode output capable of driving resistive loads without buffering.

[1] A. Balteanu, et. al., "A 6-bit Segmented RZ DAC Architecture with up to 50-GHz Sampling Clock and 4 $V_{pp}$ Differential Swing", *IEEE Int. Microwave Symp.* (IMS), 2012 IEEE.

[2] H. Huang, et. al, "An 8-bit 100-GS/s Distributed DAC in 28-nm CMOS for Optical Communications", *IEEE Transactions on Microwave Theory and Techniques*, vol. 63, no. 4, pp. 1211-1218, April 2015.

SUMMARY OF THE INVENTION

Disclosed herein is a current impulse (CI) digital-to-analog converter (DAC) that may be configured in a k-bit array of switched capacitors and type II current conveyors (CCII). Typically, the switched capacitors, the reference voltages, or a combination of the two are weighted depending upon the significance of bit position. In one aspect, the CI DAC array can be enabled in a time-interleaved configuration. Advantageously, the performance of an type II current conveyor can be approximated using a single metal-oxide-semiconductor (MOS) transistor in a common gate amplifier configuration with a low, but not zero, input impedance at the x-terminal that mirrors the in-going current to the y-terminal with a high, but finite, output impedance.

Accordingly, a current impulse method is provided for converting digital data signals to analog values. The method accepts a digital data bit, and converts the digital data bit into a current impulse. In turn, the current impulse is converted into an analog current representing the digital data bit. More typically, the method accepts a k-bit digital word, and converts the k-bit digital word into (k) corresponding current impulses. The (k) current impulses are then converted into an analog current representing the k-bit digital word. Alternatively, the k-bit digital word is converted into a summed current impulse, and then concerted to analog current.

In one aspect, the method accepts (n) consecutive k-bit digital words. Then, for each bit position in the k-bit digital word, (n) consecutive bits are sampled using (n) consecutive phases of an n-phase clock, creating (n) interleaved current impulses. The (n) interleaved current impulses are then converted into an analog current representing the (n) consecutive k-bit digital words. Alternatively, (n) consecutive bits are sampled using (n) consecutive phases of an n-phase clock for each bit position in the k-bit digital word, creating (n) summed current impulses. Then, the (n) summed current impulses are converted into an analog current representing the (n) consecutive digital words.

Additional details of the above-described method and CI DAC circuitry are described below.

DETAILED DESCRIPTION

Figure 4:
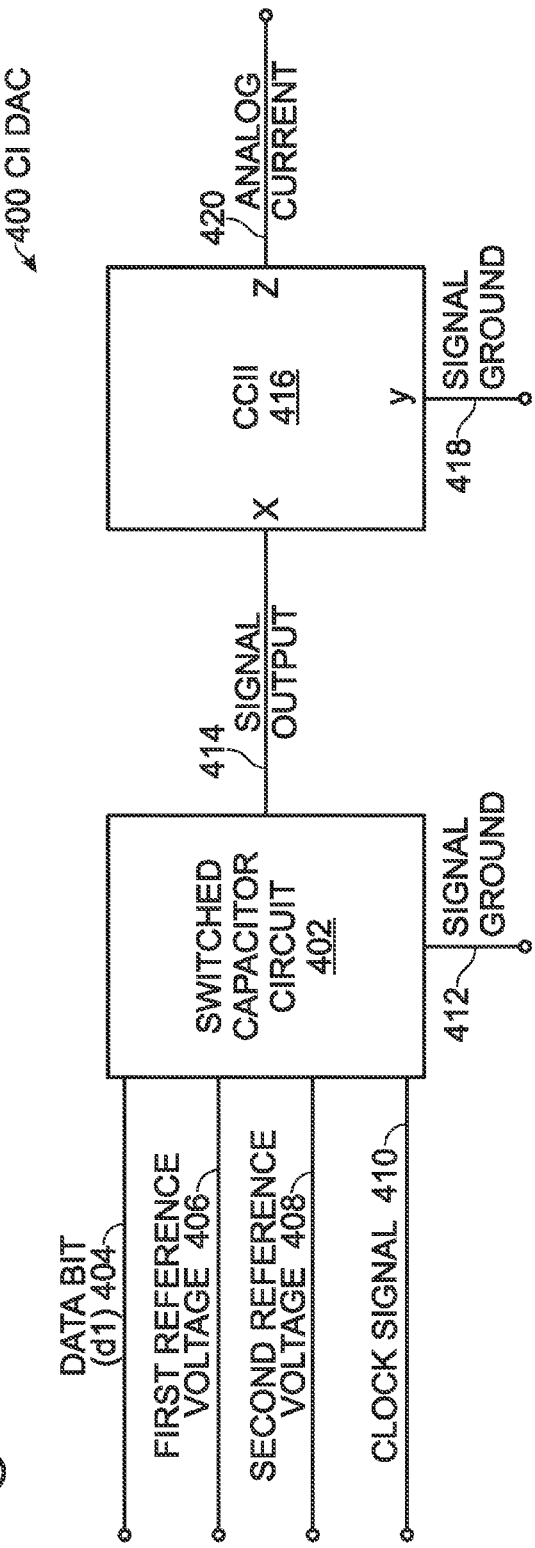
FIG. 4 is a schematic block diagram of a current impulse (CI) digital-to-analog converter (DAC).

FIG. 4 is a schematic block diagram of a current impulse (CI) digital-to-analog converter (DAC). The CI DAC 400 comprises a first switched capacitor circuit 402 having an input on line 404 to accept a digital data bit, an input on line 406 to accept a first reference voltage, an input on line 408 to accept a second reference voltage, and an input on line 410 to accept a clock signal. The switched capacitor circuit 402 has an output connected to a signal ground on line 412, and a signal output on line 414 to supply a current impulse in response to the inputs.

A first type II current conveyor (CCII) 416 has an x terminal connected to line 414 to accept the current impulse, a y terminal connected to a signal ground on line 418, and a z terminal to supply an analog current on line 420 responsive to the current impulse. A sign (i.e., + or −) following the term "CCII" indicates the output current direction. Some examples of a CCII− are provided below. However, the CI DAC can also be enabled with a CCII+. Typically, the signal grounds for the switched capacitor circuit 402 and CCII 416 are the same, but they need not be so. In one aspect, the signals grounds on lines 412 and 418 are ground, as well as the second reference voltage on line 408. In another aspect, the second reference voltage is a negative voltage.

FIGS. 5A through 5E depict some exemplary switched capacitor circuits. The switched capacitor circuit 402 of FIG. 5A comprises a capacitor 500 having a first terminal on line 502, and a second terminal connected to the signal ground on line 412. A first switch 504 has a first input selectively connected to the first reference voltage on line 406, a second input selectively connected to the second reference voltage on line 408, a control input to accept the digital data bit on line 404, and an output connected to the capacitor first terminal on line 502 to supply a reference voltage selected in response to the digital data bit. A second switch 506 has a clock signal input to accept the clock signal on line 410, an input connected to the capacitor first terminal on line 502, and the signal output that is selectively connected to the capacitor first terminal in response to the clock signal, to supply the current impulse on line 414.

Figure 1A:
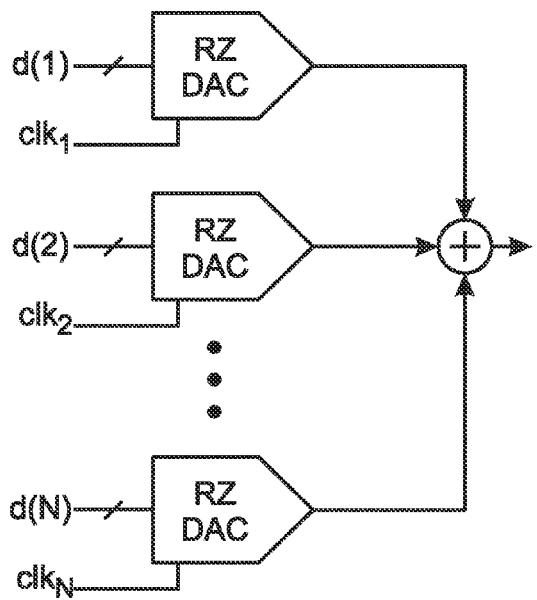
FIG. 1A is a schematic depicting the general concept of an interleaved DAC.
Figure 1B:
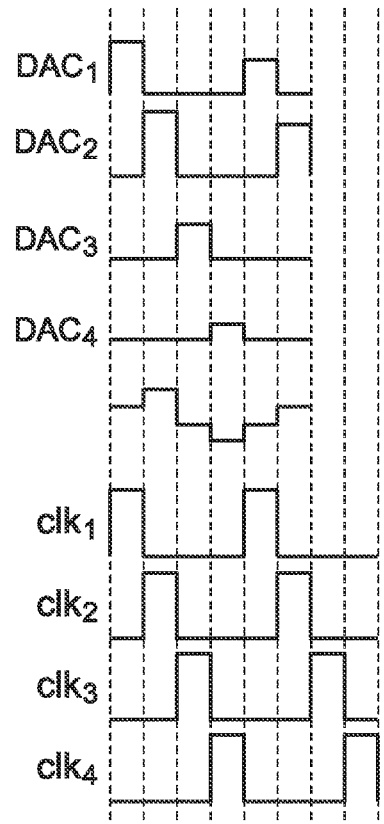
FIG. 1B depicts associated waveforms (prior art).
Figure 2:
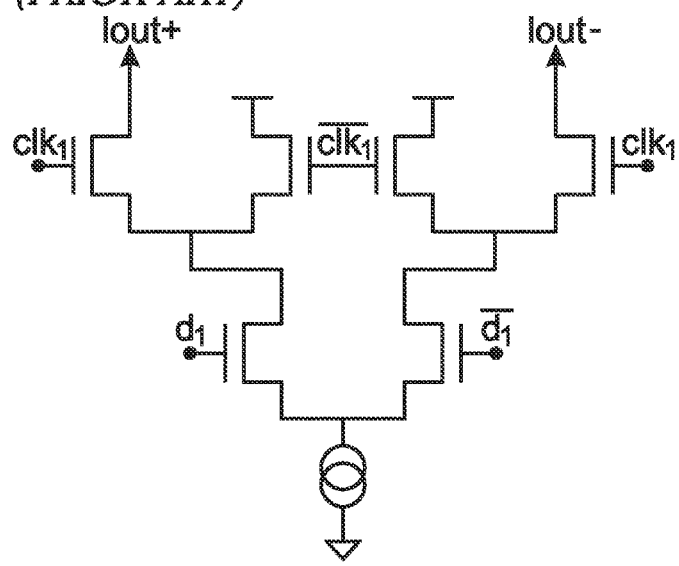
FIG. 2 is a schematic depicting a simplified unit cell in a return-to-zero current steering DAC (prior art).
Figure 3:
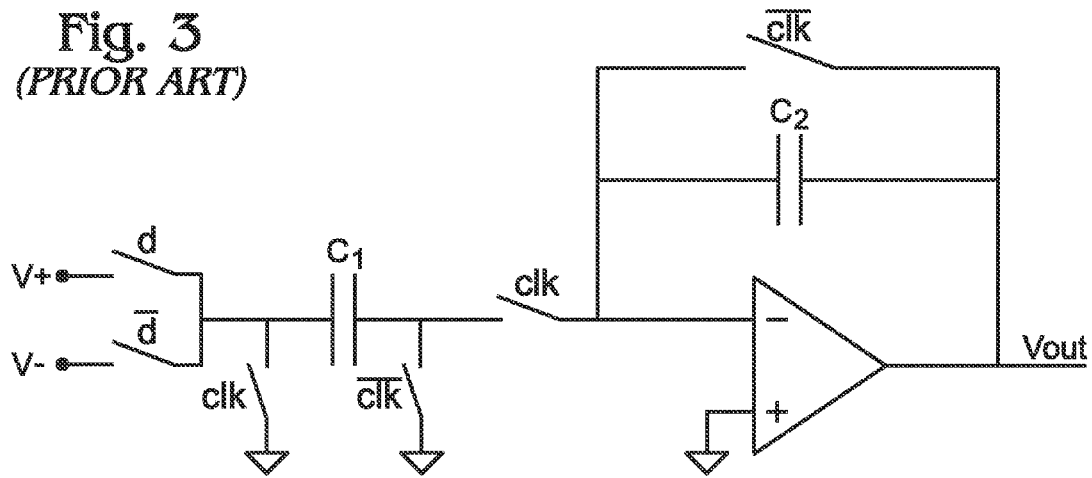
FIG. 3 is a schematic depicting a switched capacitor DAC cell (prior art).
Figure 5A:
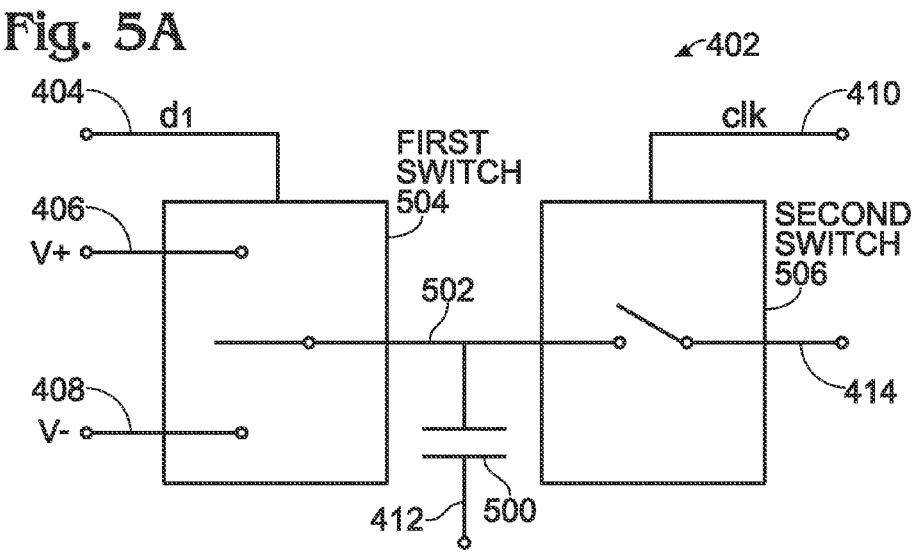
FIGS. 5A through 5E depict some exemplary switched capacitor circuits.
Figure 5B:
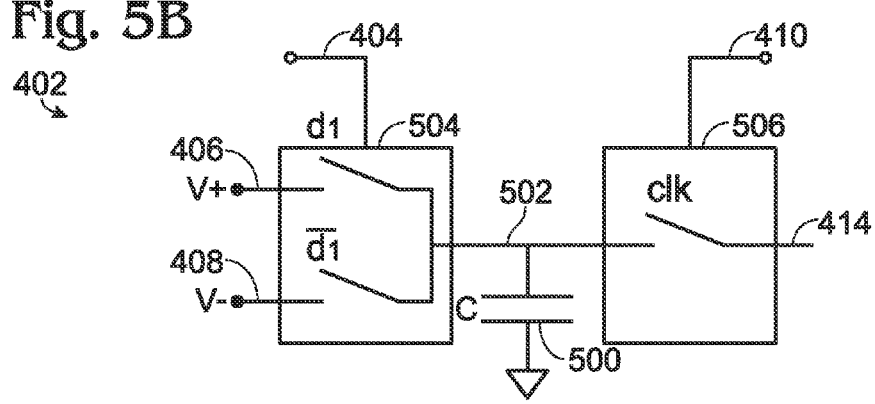
Figure 5C:
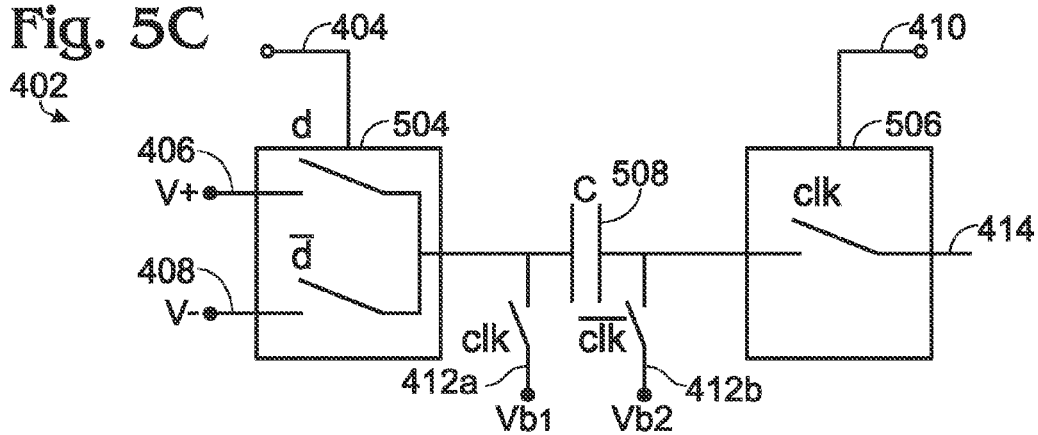
Figure 5D:
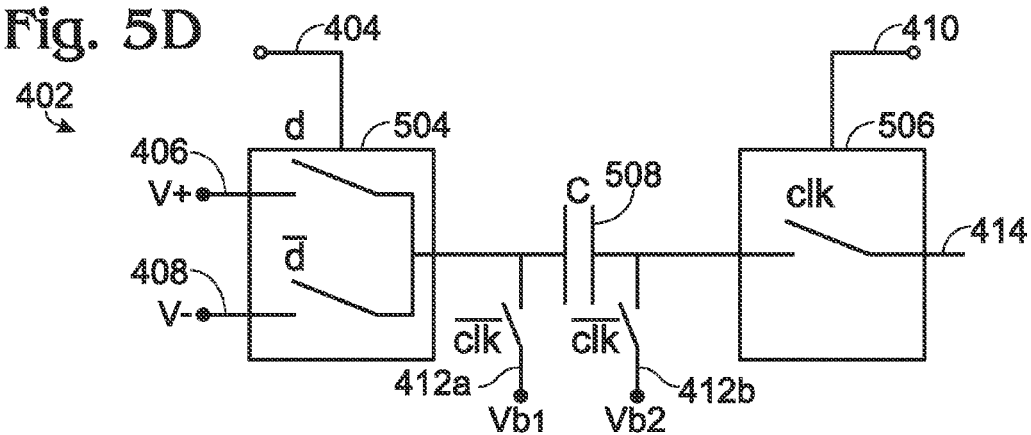
Figure 5E:
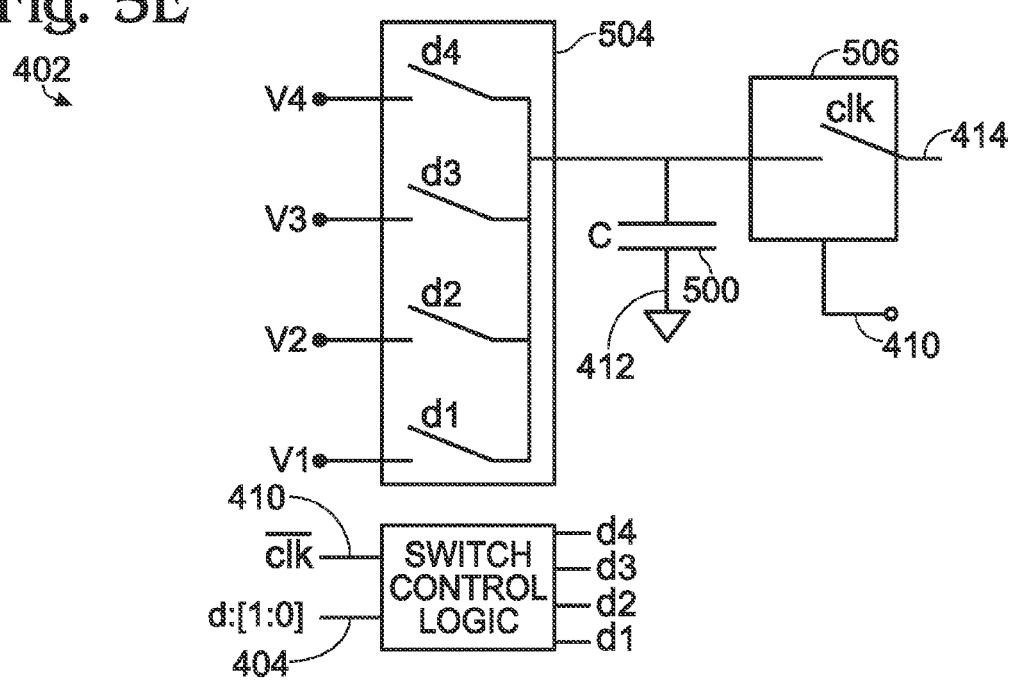

The switched capacitor circuit of FIG. 5B is a slight variation of the circuit of FIG. 5A, where the first switch 504 is enabled with either the digital data bit or its complement. In FIG. 5C a series capacitor 508 has a first terminal connected to signal ground on line 412a (Vb1) during a first phase of the clock when the current impulse is supplied to the CCII, and a second terminal that is connected to signal ground on line 412b (Vb2) during the second phase of the clock. The circuit of FIG. 5D is similar to the circuit of FIG. 5C, except that both terminals of capacitor 508 are connected to signal ground during the second clock phase. In FIG. 5E switch control logic 510 accepts two data bits and is enabled at the second phase of the clock. In this aspect the first switch is able to selectively connect to four possible reference voltages: V1, V2, V3, and V4, in response to control signals d1, d2, d3, and d4, respectively. Many other types of switch capacitor circuits are known in the art that would likewise enable the CI DAC of FIG. 4.

Figure 6B:
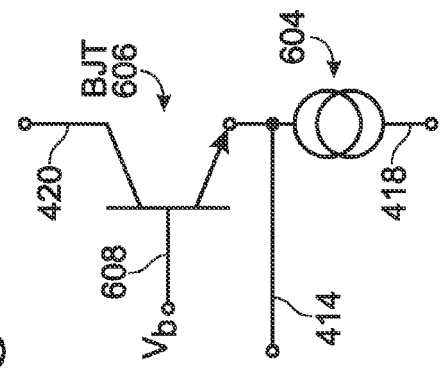
FIGS. 6A and 6B are schematic drawings depicting exemplary CCII-circuits.
Figure 6A:
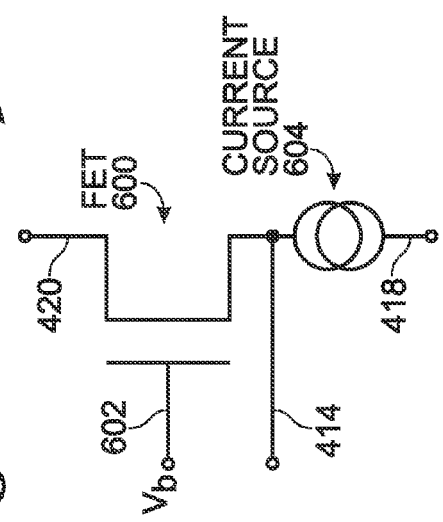

FIGS. 6A and 6B are schematic drawings depicting exemplary CCII− circuits. Generally, a current conveyor is an abstraction for a three terminal electronic device in the form of an amplifier with unity gain. An ideal CCII can be seen as an ideal transistor, with perfected characteristics. No current flows into the gate or base, which is represented by y. There is no base-emitter or gate-source voltage drop, so the emitter or source voltage (at x) follows the voltage at y. The gate or base has an infinite input impedance (y), while the emitter or source has a zero input impedance (x). Any current out of the emitter or source (x) is reflected at the collector or drain (z) as a current in, but with an infinite output impedance.

In FIG. 6A a field effect transistor (FET) 600 has a gate connected to a bias voltage (Vb) on line 602, a source connected to the signal output of the first switched capacitor circuit on line 414, and a drain to supply the analog current on line 420. A current source 604 has a first terminal connected to the FET source on line 414 and a second terminal connected to the signal ground on line 418.

In FIG. 6B a bipolar junction transistor (BJT) 606 has a base connected to a bias voltage (Vb) on line 608, an emitter connected to the signal output of the first switched capacitor circuit on line 414, and a collector to supply the analog current on line 420. A current source 604 has a first terminal connected to the BJT emitter on line 414 and a second terminal connected to the signal ground on line 418.

Figure 14:
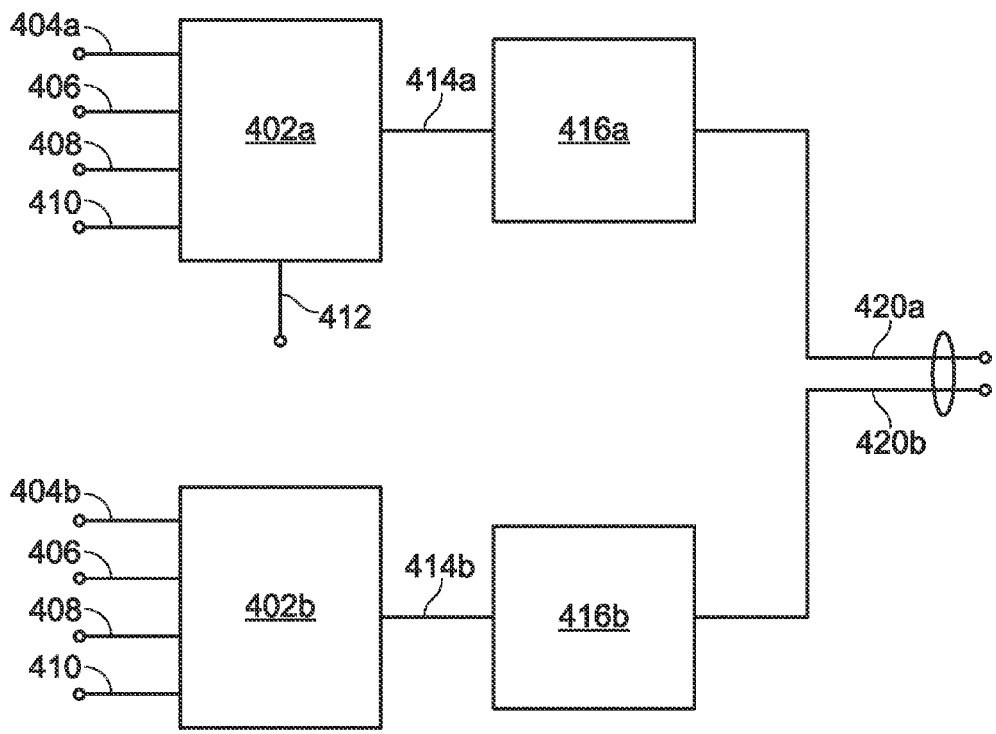
FIG. 14 is a schematic block diagram depicting a pseudo-differential version of the CI DAC.

The simple open-loop amplifiers of FIGS. 6A and 6B have very wide bandwidths. These amplifiers have a low, but not zero, input impedance and high, but not infinite, output impedance. Neither of these limitations have significant impact on the operation of the DAC. What does have an impact is the non-linear large signal behavior of the device. As the gate-source voltage has a square root dependency on the current, the pulse shape becomes non-linear. Since the nonlinearity is mostly even order, it can be avoided by using the pseudo-differential topology as shown in FIG. 14. Such linearity is adequate for a seven to nine bit effective resolution range. Other, more conventional CCII circuitry is known in the art that may be used to enable the CI DAC.

Figure 7:
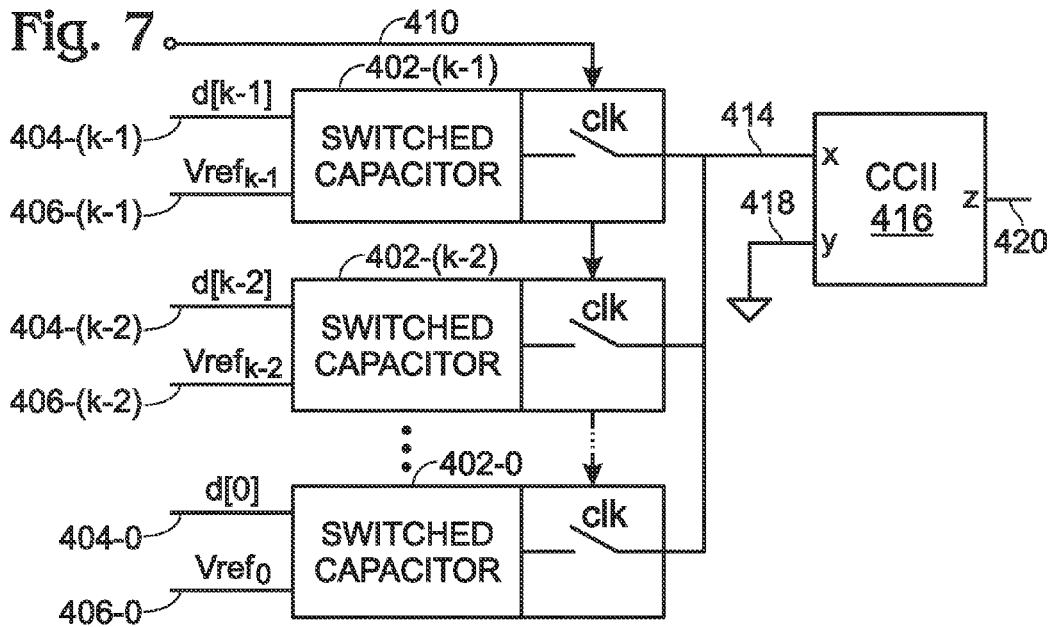
FIG. 7 is a schematic block diagram depicting the CI DAC enabled as an array (k) of switched capacitor circuits.

FIG. 7 is a schematic block diagram depicting the CI DAC enabled as an array (k) of switched capacitor circuits. Each switched capacitor circuit 402-0 through 402-(k−1) accepts a unique digital data bit from a k-bit digital word, respectively, 404-0 through 404-(k−1). Each switched capacitor circuit has a signal output on line 414 connected to the x terminal of the CCII 416. For simplicity, only reference voltage 406-0 through 406-(k−1) are shown being supplied respectively to each switched capacitor circuit. In this example it can be assumed that the other reference voltage (not shown) is the same as signal ground, which is also not shown.

Figure 8:
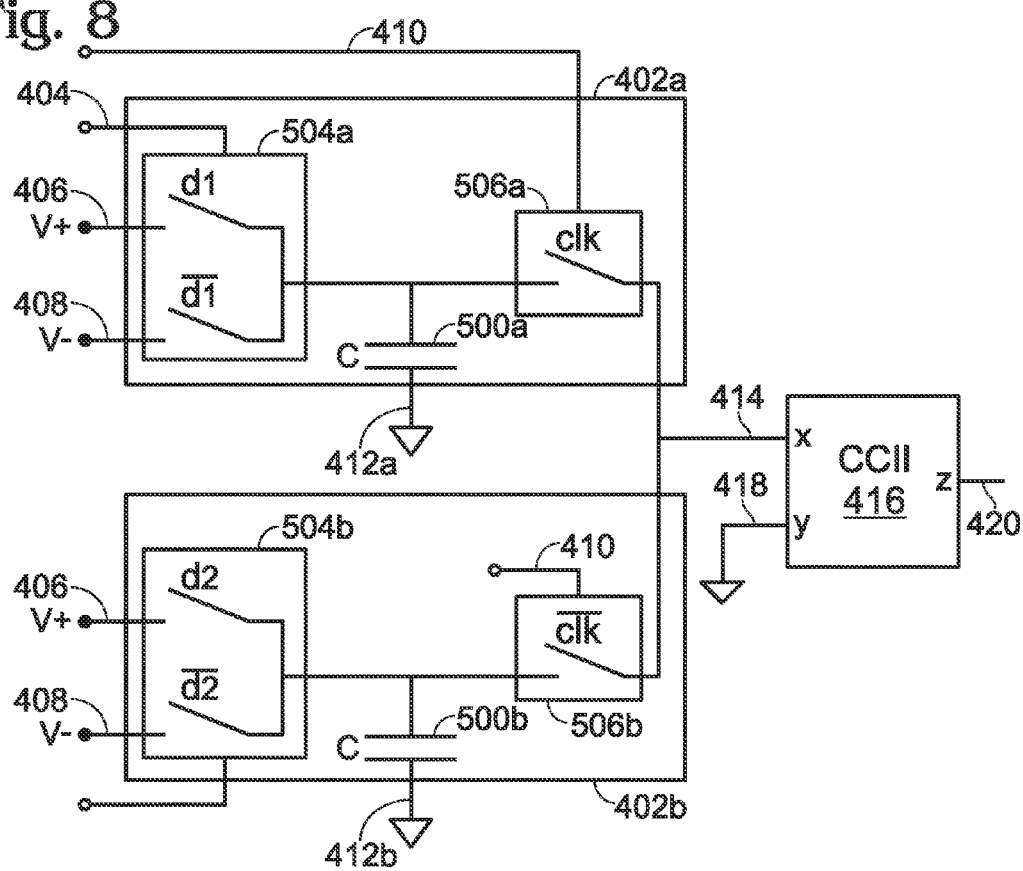
FIG. 8 is a schematic block diagram depicting a single-bit, two times interleaved CI DAC.

FIG. 8 is a schematic block diagram depicting a single-bit, two times interleaved CI DAC. This circuit is a special case of the more generic structure depicting in FIG. 10. The switched capacitor circuits 402a and 402b accept consecutive digital data bits, in the same bit position, from a k-bit digital word supplied on line 404. In this case, switched capacitor circuit 402a accepts digital data bit d1 (and its complement), and switched capacitor circuit 402b accepts digital data bit d2 (and its complement). Each switched capacitor circuit has a signal output on line 414 connected to the x terminal of the CCII 416. Although switches 504a and 504b are shown as enabled using a digital data bit and its complement, the switched capacitor circuits could likewise be enabled without complementary signals, as depicted in FIG. 5A. The two switched capacitors are operated in interleaved fashion to produce current pulses during both clock phases.

Typically, the switched capacitor circuits supply weighted current impulse values on line 414 responsive to the significance of the digital data bit in the k-bit digital word. The switched capacitor circuits may weight current impulse values using weighted capacitance values, weighted reference voltages, or combinations thereof. Taking FIG. 7 as an example, switch capacitor circuit 402-($k$−1) may have a larger capacitance, to supply a larger current impulse, if it converts a higher digital bit position that switched capacitor circuit 402-($k$−1). As another example, reference voltages may increase in value from 406-0 through 406-($k$−1) as the digital bit position of the associated switched capacitor circuits increases.

Figure 9:
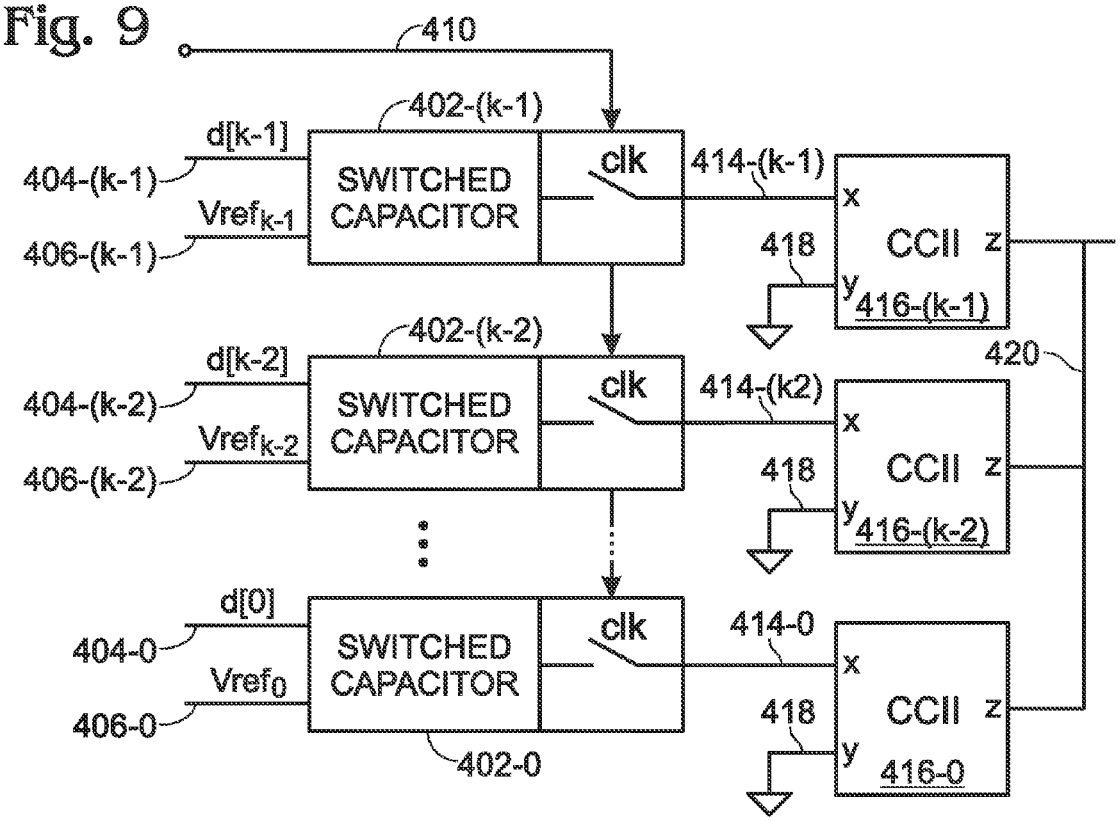
FIG. 9 is a schematic block diagram depicting another variation of the CI DAC enabled as an array (k) of switched capacitor circuits.

FIG. 9 is a schematic block diagram depicting another variation of the CI DAC enabled as an array (k) of switched capacitor circuits. As in FIG. 7, each switched capacitor circuit 402-0 through 402-($k$−1) accepts a unique digital data bit from a k-bit digital word, respectively on lines 404-0 through 404-($k$−1). A group of (k) type II current conveyors is show, 416-0 through 416-($k$−1), where the x terminal of each CCII is connected to the signal output of a corresponding switched capacitor circuit, respectively, 414-0 through 414-($k$−1), and where z terminals of the CCIIs in the group are summed to a common analog current node on line 420. For simplicity, only reference voltage 406-0 through 406-($k$−1) are shown being supplied respectively to each switched capacitor circuit. In this example it can be assumed that the other reference voltage (not shown) is the same as signal ground, which is also not shown. As in the examples of FIG. 7, the switched capacitor circuits may supply weighted current impulse values responsive to the significance of the digital data bit in the k-bit digital word using weighted capacitance values, weighted reference voltages, or combinations thereof.

Figure 10:
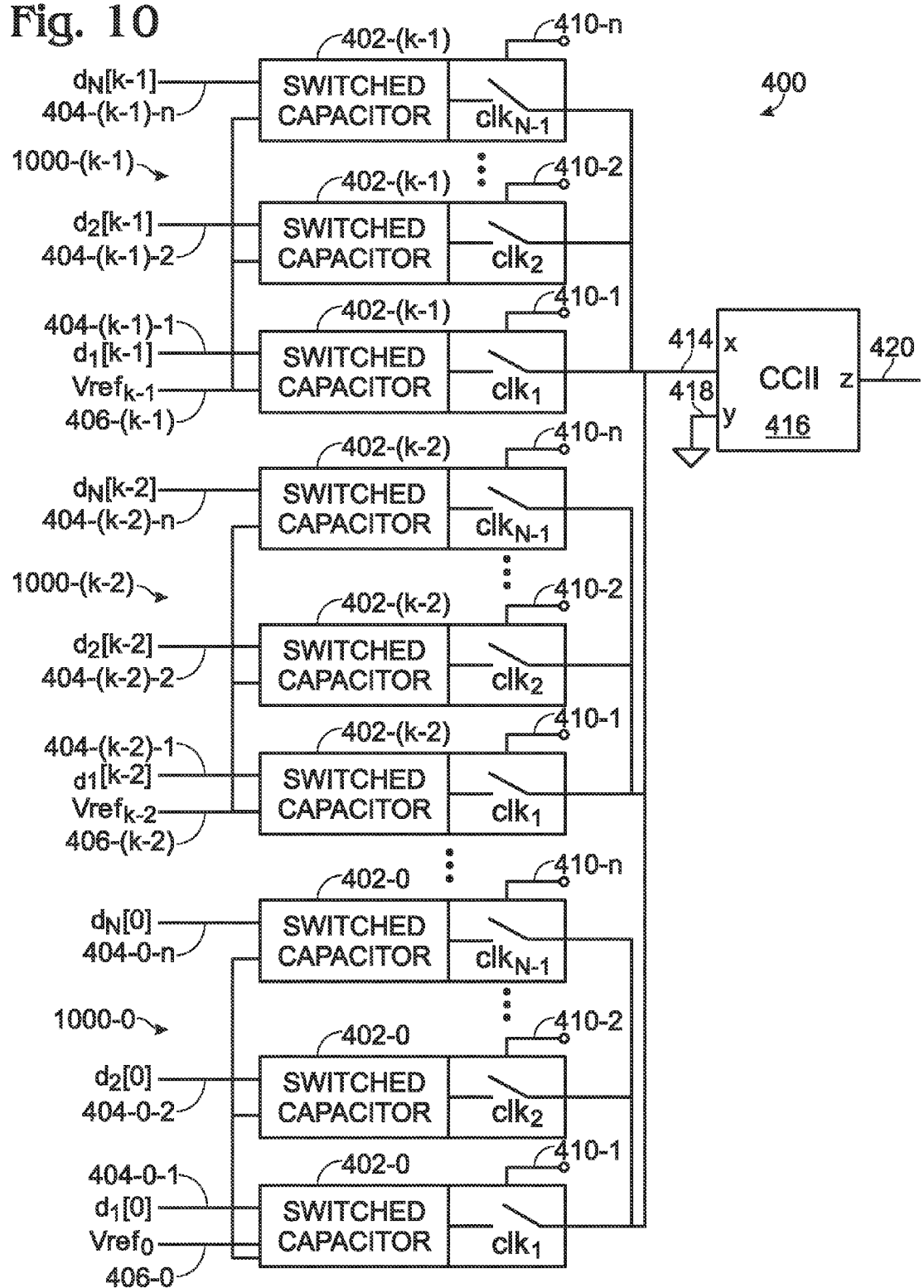
FIG. 10 is a schematic block diagram depicting a time-interleaved variation of the CI DAC.

FIG. 10 is a schematic block diagram depicting a time-interleaved variation of the CI DAC. A plurality of (k) switched capacitor circuit arrays are shown, 1000-0 through 1000-($k$−1). Each array comprises (n) switched capacitor circuits, where each array accepts (n) consecutive data bits for a corresponding bit position in the (n) consecutive k-bit digital words. In this example n=3, although the CI DAC 400 may be any integer greater than or equal to 1. For example, for array 1000-0 the accepted data bits are 404-0-1 through 404-0-$n$, where the zero after 404 represents the bit position in the k-bit digital word, and the trailing symbol represents the order of the (n) digital words. The (n) switched capacitor circuits in each array are sampled with a corresponding clock phase of an n-phase clock, 410-1 through 410-$n$. Every switched capacitor circuit has a signal output on line 414 connected to the x terminal of the CCII 416.

Figure 11:
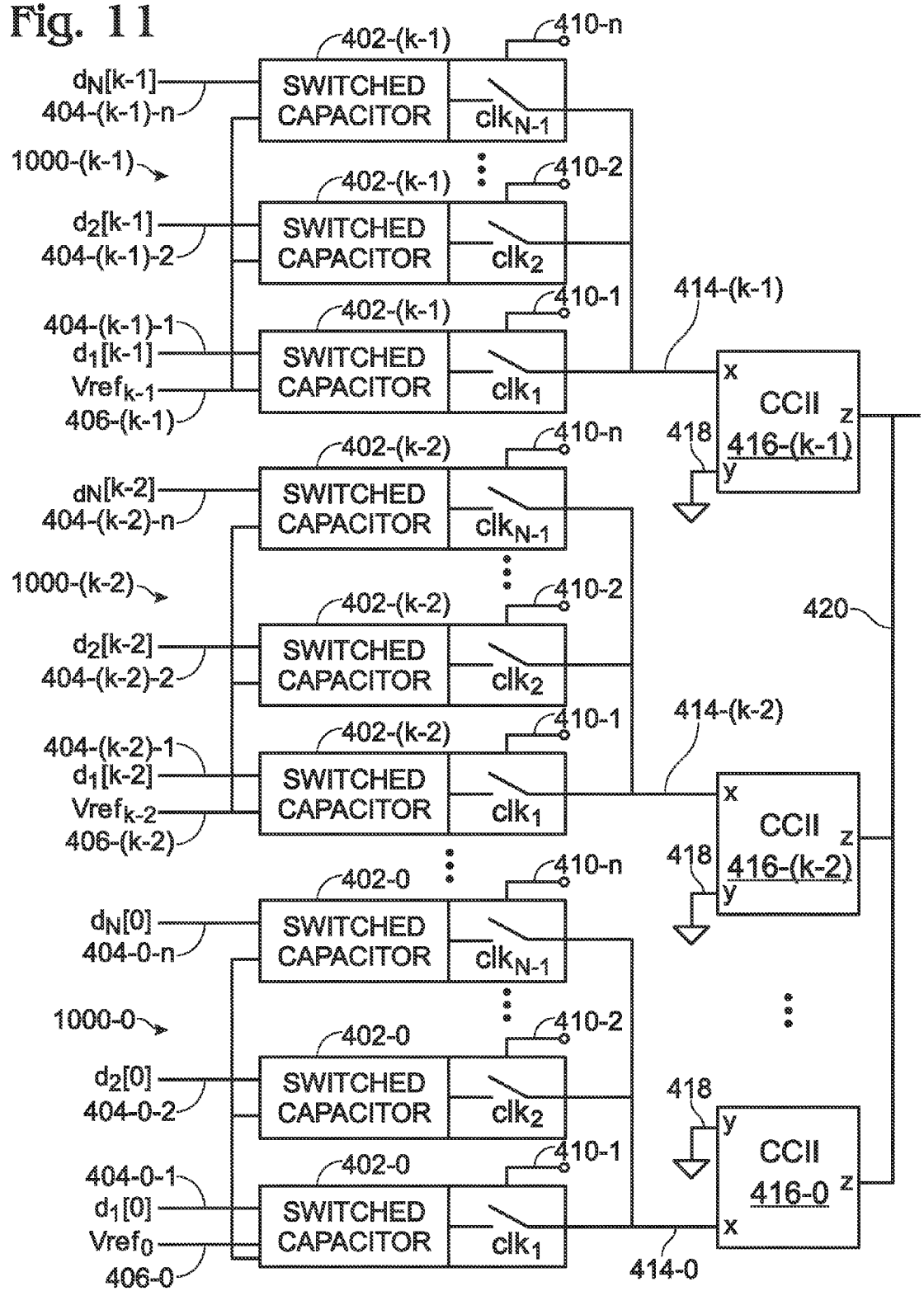
FIG. 11 is a schematic block diagram depicting a second time-interleaved variation of the CI DAC.

FIG. 11 is a schematic block diagram depicting a second time-interleaved variation of the CI DAC. A plurality of (k) switched capacitor circuit arrays are shown, 1000-0 through 1000-($k$−1). Each array comprises (n) switched capacitor circuits, where each array accepts (n) consecutive data bits for a corresponding bit position in the (n) consecutive k-bit digital words. In this example n=3, although the CI DAC 400 may be any integer greater than or equal to 1. The (n) switched capacitor circuits in each array are sampled with a corresponding clock phase of an n-phase clock, 410-1 through 410-$n$. The signal outputs of the switched capacitor circuits in each array are summed at a common corresponding signal output node. The common signal output nodes for the arrays are on lines 414-0 through 414-($k$−1).

A group of (k) type II current conveyors is shown, 416-0 through 416-($k$−1). The x terminal of each CCII 416-0 through 416-($k$−1) is connected to the common signal output node of a corresponding switched capacitor circuit array, respectively, 414-0 through 414-($k$−1). The z terminals of the CCIIs in the group are summed to a common analog current node on line 420.

Figure 12A:
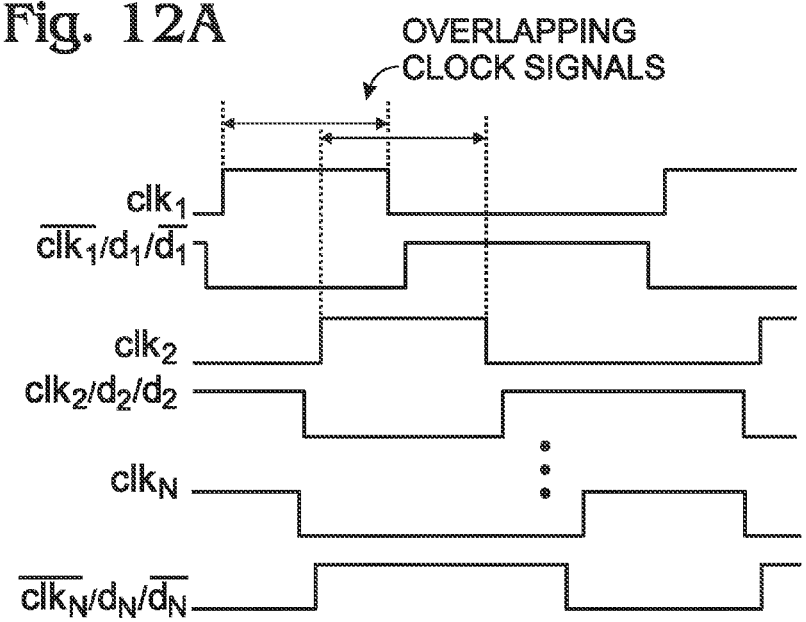
FIGS. 12A and 12B are timing diagrams associated with the CI DAC arrays of both FIG. 10 and FIG. 11.
Figure 12B:
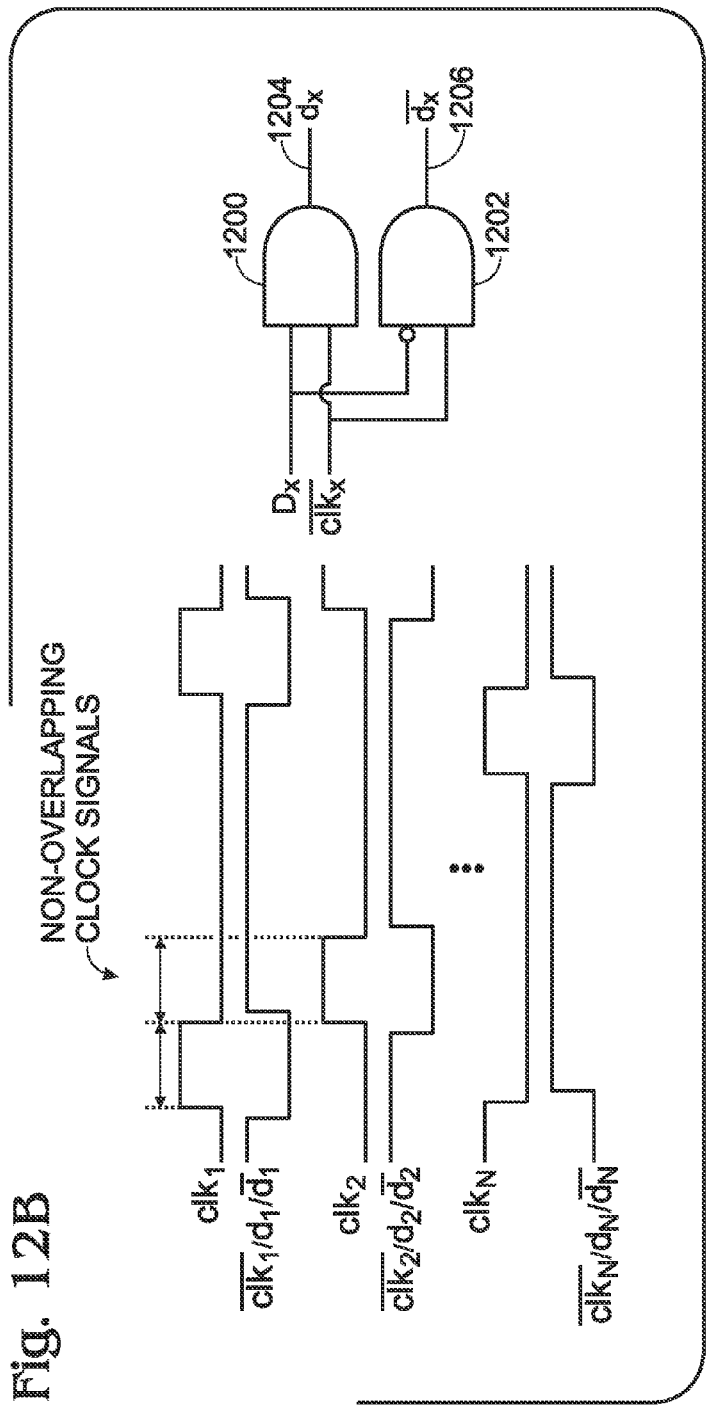

FIGS. 12A and 12B are timing diagrams associated with the CI DAC arrays of both FIG. 10 and FIG. 11. In either system, the (n) phases of the clock may be overlapping clock phases, and shown in FIG. 12A, or non-overlapping clock phases, as shown in FIG. 12B. An overlapping clock phase has a rising edge that occurs before a falling edge of a preceding clock phase, and a falling edge that occurs after the rising edge of a subsequent clock phase. A non-overlapping clock phase has a rising edge that occurs simultaneously with or after a falling edge of a preceding clock phase, and a falling edge that occurs simultaneously with or before the rising edge of a subsequent clock phase.

The two AND-gates in FIG. 12B (1200 and 1202) are an exemplary circuit for generating the complementary control signals for the switched capacitor circuits from a digital data bit Dx (d1 through dn). The control signals have the same timing as the complementary clock signal, resulting in a logic-high pulse during complementary clock high period in dx (line 1204) and no pulse on complementary dx (line 1206) if the data bit Dx is high, and a pulse on complementary dx and no pulse on dx if the data bit is low. While the data bits are a digital signal changing once every clock cycle, the control signals are return-to-zero pulses, with precise timing relative to clock, here accomplished by gating the digital data bit with the analog clock.

Figure 13:
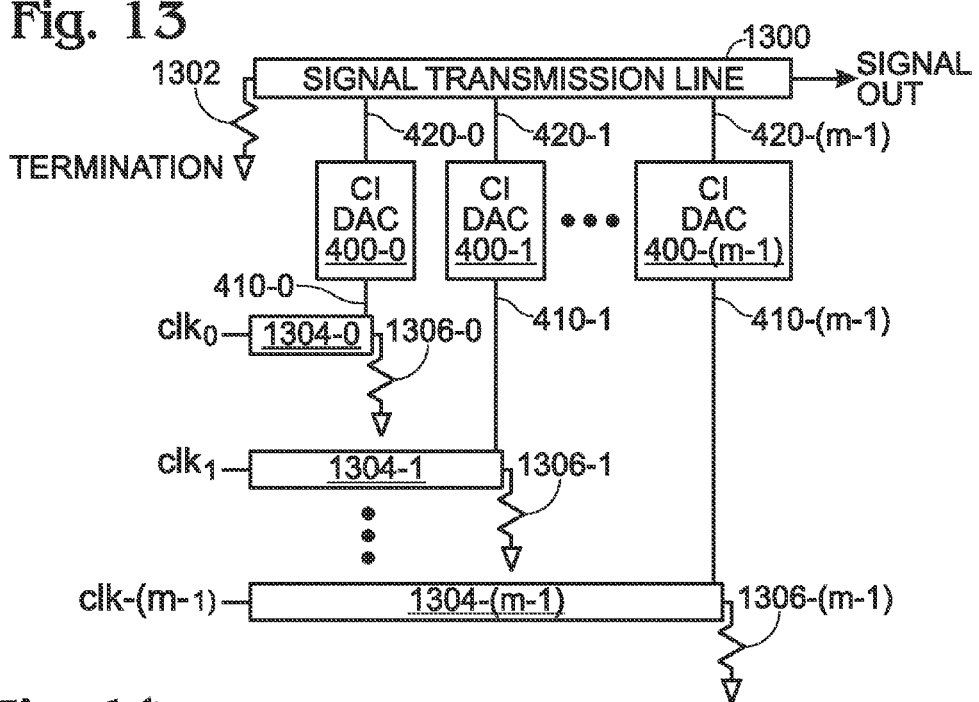
FIG. 13 is a schematic block diagram depicting impedance matching for an array of CI DACs.

FIG. 13 is a schematic block diagram depicting impedance matching for an array of CI DACs. Shown is a plurality of (m) CI DACs, 400-0 through 400-($m$−1). The z terminal of each CI DAC on line 420-0 through 420-($m$−1) has a capacitive output impedance, and the clock signal input of each CI DAC on lines 410-0 through 410-($m$−1) has a capacitive input impedance. A signal transmission line 1300 has a characteristic impedance (e.g., 50 ohms) with a first terminal connected to a real impedance 1302 and a second terminal providing an analog output voltage (signal out). A plurality of (n) clock transmission lines is shown, respectively, 1304-0 through 1304-($m$−1). Each clock transmission line has a characteristic impedance (e.g., 50 ohms) with a first end accepting a corresponding phase of an n-phase clock and a second end connected to a real impedance 1306-0 through 1306-($m$−1). The (m) CI DACs are connected to the signal transmission line 1300 at (m) locations between the first and second terminals, and the capacitive output impedance of the (m) CI DAC z terminals 420-0 through 420-($m$−1) are absorbed into the characteristic impedance of the signal transmission line. The capacitive input impedance of each CI DAC clock signal input 410-0 through 410-(m−1) is absorbed into the characteristic impedance of the corresponding clock transmission line 1304-0 through 1306-(m−1). The transmission lines can be enabled as microstrip structures or constructed from lumped elements such as inductors and capacitors, as would be understood by a practitioner with ordinary skill in the art. By "absorbed into" it is meant that the input and output impedances of the CI DACs are modeled into the design of the transmission lines such that the transmission lines terminate in a real impedance for matching with connected circuitry such as clocks and amplifiers.

FIG. 14 is a schematic block diagram depicting a pseudo-differential version of the CI DAC. Similar to FIG. 4, a first switched capacitor circuit 402a has an input on line 404a to accept a digital data bit, an input on line 406 to accept a first reference voltage, an input on line 408 to accept a second reference voltage, and an input on line 410 to accept a clock signal. The first switched capacitor circuit 402a has an output connected to a signal ground on line 412, and a signal output on line 414a to supply a current impulse in response to the inputs.

A first CCII 416a has an x terminal connected to line 414a to accept the current impulse, a y terminal connected to a signal ground on line 418, and a z terminal to supply a positive component of a pseudo-differential analog current on line 420a responsive to the current impulse on line 414a.

A second switched capacitor circuit 402b has inputs to accept a complement of the digital data bit on line on line 404b, the first reference voltage on line 406, the second reference voltage on line 408, and the clock signal on line 410. The second switched capacitor circuit 402b has an output on line 412 connected to the signal ground, and a signal output on line 414b to supply a current impulse in response to the inputs.

A second CCII 416b has an x terminal to accept the current impulse on line 414b from the second switch capacitor circuit, a y terminal connected to the signal ground on line 418, and a z terminal to supply a negative component of the pseudo-differential analog current on line 420b. As another alternative, the first switched capacitor circuit 402a and the second switched capacitor circuit 402b may accept the same digital data bit, but with reference voltages supplied to the two switched capacitor circuits are reversed (opposite).

Figure 15:
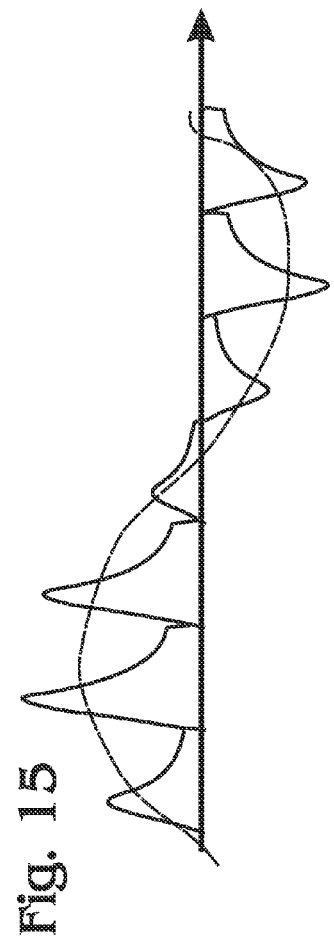
FIG. 15 is a diagram of the output pulses associated the CI DAC presented above.

FIG. 15 is a diagram of the output pulses associated the CI DAC presented above. An ideal switched capacitor current source produces infinitely narrow current impulses that can be modeled with Dirac's delta function. This is neither practical nor desirable. Instead, as in any real switch, there is some series resistance, and the output current pulses become steps that exponentially decay towards zero. The pulses in the figure represent output current and the sinusoidal curve represents the output voltage after some low-pass filtering.

Figure 16:
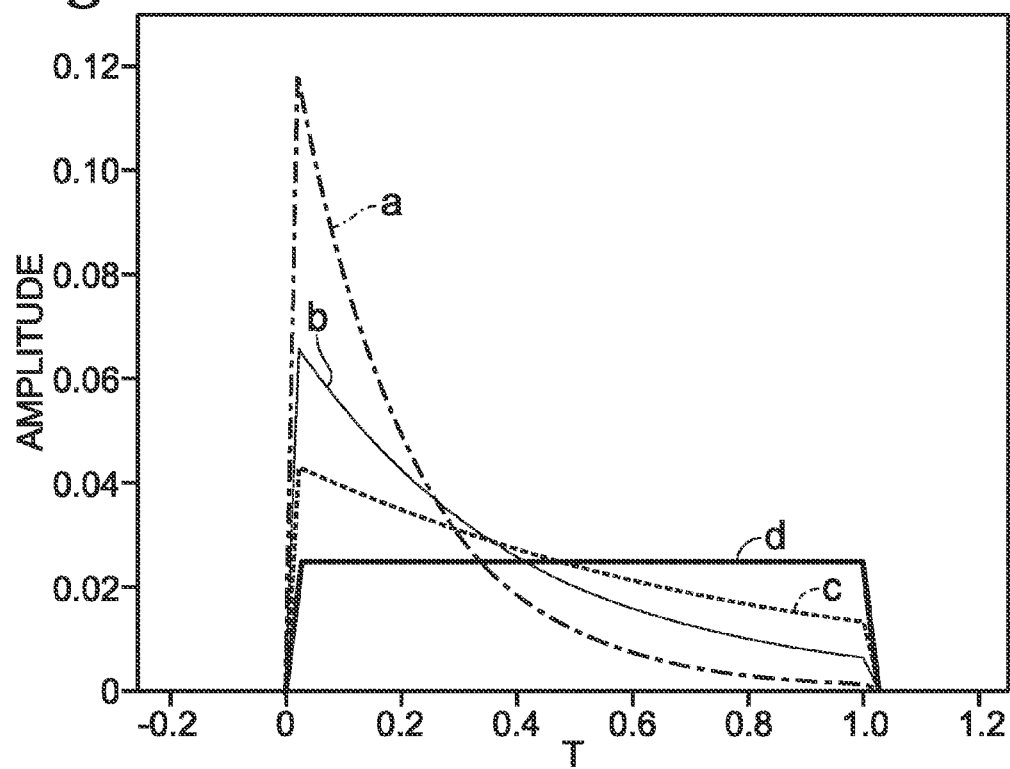
FIG. 16 is a graph comparing a rectangular pulse, as used in conventional current steering DACs, and several exponential decay pulses, which have been truncated to the length of one clock period.

FIG. 16 is a graph comparing a rectangular pulse, as used in conventional current steering DACs, and several exponential decay pulses, which have been truncated to the length of one clock period. These waveforms model a capacitor discharged through a resistor and then disconnected at the end of the clock period. The pulses have been scaled such that the total integrated current is the same in all cases. It can be seen that the faster the decay, the sharper and taller the pulse is in the beginning, and more complete the decay before the end of the clock phase. As the decay is made slower, the pulses increasingly begin to resemble the rectangular pulse.

Figure 17:
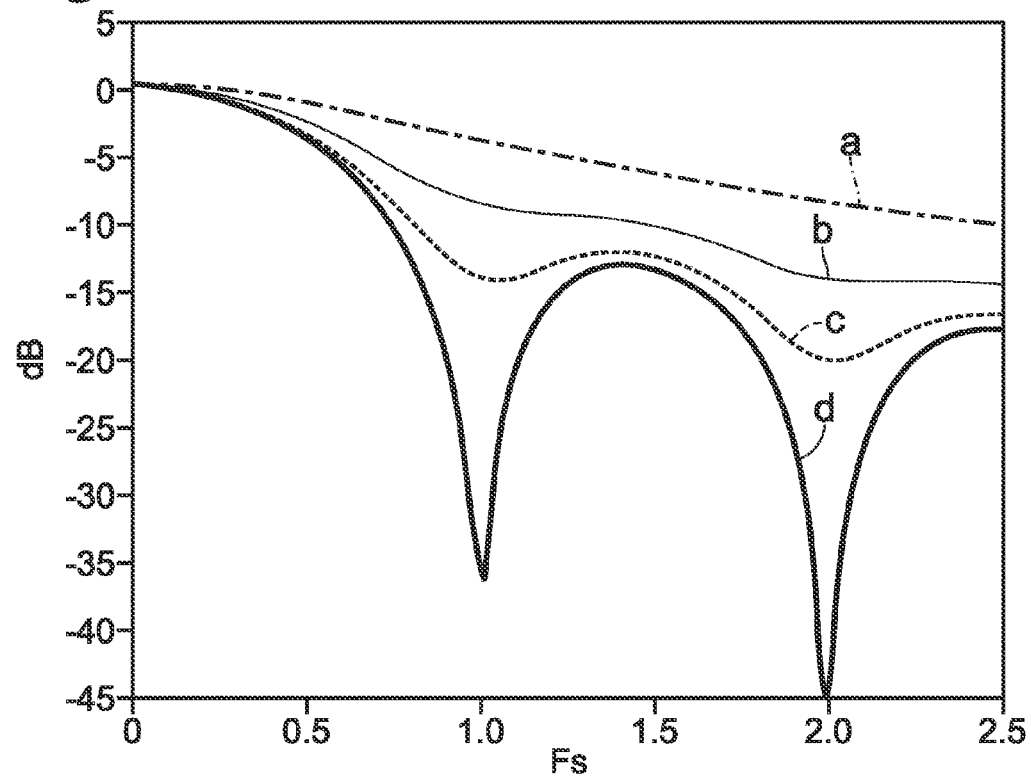
FIG. 17 shows the frequency responses of the pulses depicted in FIG. 16.

FIG. 17 shows the frequency responses of the pulses depicted in FIG. 16. The rectangular pulse (d) has the familiar sin(x)/x response with notches at multiples of Fs. The sharpest exponential pulse (a) gives the flattest frequency response, with no visible notches, while with heavier truncation, the curves more closely resemble the sin(x)/x function. Among other things, the flatter frequency response opens up the opportunity to interleave partially overlapping exponential decay pulses with only a modest impact on the signal bandwidth. Thus, very narrow clock pulses are not required.

While attractive in theory, the very sharp pulses have a high peak current that has to be supported by the current conveyor, making them very power inefficient. The (b) pulses may be more practical for most applications.

Figure 18:
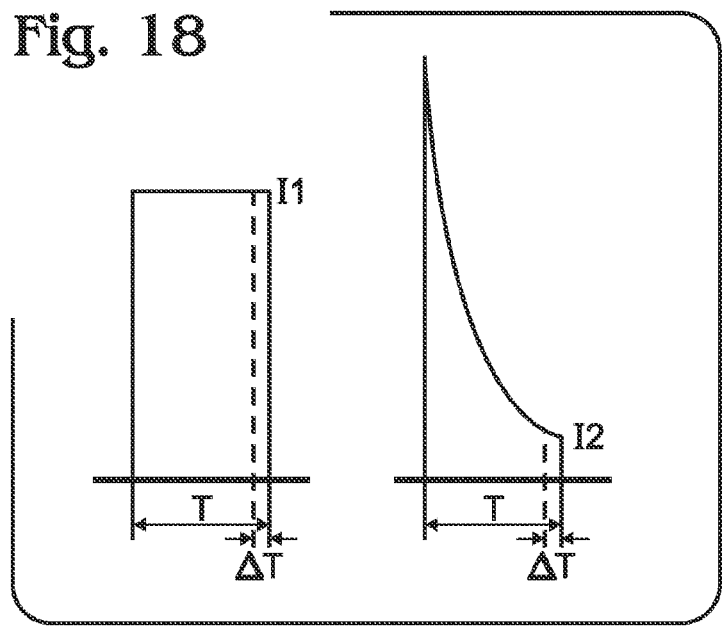
FIG. 18 compares the jitter sensitivity of the rectangular pulse and the truncated exponential decay pulse.

FIG. 18 compares the jitter sensitivity of the rectangular pulse and the truncated exponential decay pulse. As shown, the error caused by the variation of the pulse length can be presented by the area defined by $I*\Delta T$, where I is the value of the current at the end of the pulse and $\Delta T$ the error in the pulse length. The more decayed the exponential pulse is at the end, the smaller the error, giving it an advantage over the rectangular return-to-zero pulses.

Based on the CI DAC example of FIG. 5B and the use of the MOS current conveyor of FIG. 6A, a comparison to a current steering DAC reveals several circuit level differences. First, while they both use a MOS current source, the one in the current steering DAC defines the signal current (i.e. the weight of the bit) and thus has a high matching requirement, leading to large size and with it large parasitic capacitance and large voltage headroom requirement. The MOS current source in the current impulse DAC is used to bias the amplifier and has much more relaxed requirements when it comes to the size and voltage headroom.

Second, the clocked switches in the current impulse DAC are operated in the linear region and act as voltage controlled resistors, the resistance being a design parameter defining the pulse decay rate. The transistor size and associated parasitic capacitance are smaller than in the current steering DAC. Moreover, some of the parasitic capacitance can be absorbed into the switched capacitor, further decreasing its effect. The switch and the capacitor are in parallel with the bias current source, and do not require additional voltage headroom.

The data switches in the CI DAC need to be effective enough to fully charge the capacitor during the charge phase, but they are not directly in the analog signal path, making them less critical. Their parasitic capacitance is in parallel with the switched capacitor and can be absorbed into it. The switch control waveforms are rail-to-rail CMOS level signals, not requiring level shifting or special driver amplifiers, making their generation simple and very fast. The same number of switched capacitor current sources is always connected to the output, unlike in the current steering DAC. This consistency has a significant positive impact on the high frequency linearity.

To summarize, a new high speed DAC architecture based on switched capacitor current sources has been presented that has the potential for achieving sampling rates up to and beyond 100 GS/s in 14 nanometer (nm) technology, with smaller interleaving factor than a return-to-zero current steering DAC. With the smaller interleaving factor and smaller output capacitance, the signal bandwidth is wider. The CI DAC also has better high frequency linearity thanks to the code independent output impedance. With a smaller voltage headroom requirement this architecture is better suited for the 14 nm technology. The exponential decay pulse provides some advantage in jitter sensitivity and has less high frequency attenuation than the rectangular pulse used in current steering DACs.

Figure 19:
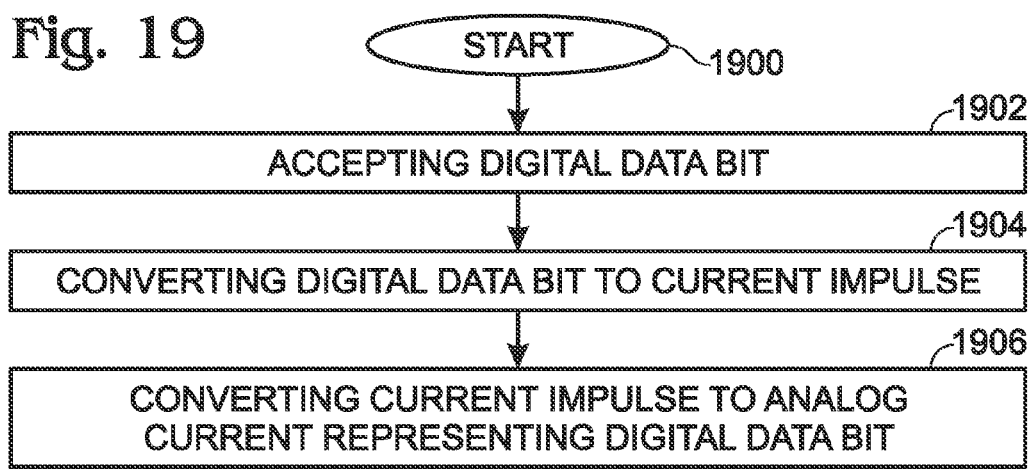
FIG. 19 is a flowchart illustrating a current impulse (CI) method for converting digital data signals to analog values.

FIG. 19 is a flowchart illustrating a current impulse (CI) method for converting digital data signals to analog values. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. Generally however, the method follows the numeric order of the depicted steps. The method may be enabled using various aspects of the CI DAC circuitry described above. The method starts at Step 1900.

Step 1902 accepts a digital data bit. Step 1904 converts the digital data bit into a current impulse. Step 1906 converts the current impulse into an analog current representing the digital data bit. In one aspect, Step 1902 accepts a k-bit digital word. Then, Step 1904 converts the k-bit digital word into (k) corresponding current impulses, and Step 1906 converts the (k) current impulses into an analog current representing the k-bit digital word. If Step 1902 accepts (n) consecutive k-bit digital words, then Step 1904 samples (n) consecutive bits using (n) consecutive phases of an n-phase clock for each bit position in the k-bit digital word, creating (n) interleaved current impulses. Step 1906 converts the (n) interleaved current impulses into an analog current representing the (n) consecutive k-bit digital words.

As another alternative, Step 1902 accepts a k-bit digital word, and Step 1904 converts the k-bit digital word into a summed current impulse. If Step 1902 accepts (n) consecutive k-bit digital words, then Step 1904 may sample (n) consecutive bits using (n) consecutive phases of an n-phase clock for each bit position in the k-bit digital word, creating (n) summed current impulses. Step 1906 converts the (n) summed current impulses into an analog current representing the (n) consecutive digital words.

A CI DAC and associated data conversion method have been provided. Examples of particular device structures and signals have been presented to illustrate the invention. However, the invention is not limited to merely these examples. Other variations and embodiments of the invention will occur to those skilled in the art.

I claim:

1. A current impulse (CI) digital-to-analog converter (DAC), the CI DAC comprising:
    a first switched capacitor circuit having inputs to accept a digital data bit, a first reference voltage, a second reference voltage, and a clock signal, an output connected to a signal ground, and a signal output to supply a current impulse in response to the inputs; and,
    a first type II current conveyor (CCII−) having an x terminal to accept the current impulse, a y terminal connected to a signal ground, and a z terminal to supply an analog current responsive to the current impulse.

2. The CI DAC of claim 1 wherein the first CCII is a CCII− and comprises:
    a field effect transistor (FET) having a gate connected to a bias voltage, a source connected to the signal output of the first switched capacitor circuit, and a drain to supply the analog current; and,
    a current source having a first terminal connected to the FET source and a second terminal connected to the signal ground.

3. The CI DAC of claim 1 wherein the first CCII is a CCII− and comprises:
    a bipolar junction transistor (BJT) having a base connected to a bias voltage, an emitter connected to the signal output of the first switched capacitor circuit, and a collector to supply the analog current; and,
    a current source having a first terminal connected to the BJT emitter and a second terminal connected to the signal ground.

4. The CI DAC of claim 1 wherein the first switched capacitor circuit comprises:
    a capacitor having a first terminal, and a second terminal connected to the signal ground;
    a first switch having a first input selectively connected to the first reference voltage, a second input selectively connected to the second reference voltage, a control input to accept the digital data bit, and an output connected to the capacitor first terminal to supply a reference voltage selected in response to the digital data bit; and,
    a second switch having the clock signal input to accept the clock signal, an input connected to the capacitor first terminal, and the signal output selectively connected to the capacitor first terminal in response to the clock signal, to supply the current impulse.

5. The CI DAC of claim 1 further comprising:
    an array (k) of switched capacitor circuits, each switched capacitor circuit accepting a unique digital data bit from a k-bit digital word, and where each switched capacitor circuit has a signal output connected to the x terminal of the CCII.

6. The CI DAC of claim 5 wherein the switched capacitor circuits supply weighted current impulse values responsive to the significance of the digital data bit in the k-bit digital word.

7. The CI DAC of claim 6 wherein the switched capacitor circuits supply weighted current impulse values in response to an element selected from a group consisting of weighted capacitance values, weighted reference voltages, and combinations thereof.

8. The CI DAC of claim 1 further comprising:
    an array (k) of switched capacitor circuits, each switched capacitor circuit accepting a unique digital data bit from a k-bit digital word;
    a group of (k) type II current conveyors, where the x terminal of each CCII is connected to the signal output of a corresponding switched capacitor circuit, and where z terminals of the CCIIs in the group are summed to a common analog current node.

9. The CI DAC of claim 8 wherein the switched capacitor circuits supply weighted current impulse values responsive to the significance of the digital data bit in the k-bit digital word.

10. The CI DAC of claim 9 wherein the switched capacitor circuits supply weighted current impulse values in response to an element selected from a group consisting of weighted capacitance values, weighted reference voltages, and combinations thereof.

11. The CI DAC of claim 1 further comprising:
    a plurality of (k) switched capacitor circuit arrays, where each array comprises (n) switched capacitor circuits, where each array accepts (n) consecutive data bits for a corresponding bit position in (n) consecutive k-bit digital words, where the (n) switched capacitor circuits in each array are sampled with a corresponding clock phase of an n-phase clock, and where every switched capacitor circuit has a signal output connected to the x terminal of the CCII.

12. The CI DAC of claim 11 wherein the (n) phases of the clock are selected from a group consisting of overlapping or non-overlapping clock phases, where an overlapping clock phase has a rising edge that occurs before a falling edge of a preceding clock phase, and a falling edge that occurs after the rising edge of a subsequent clock phase, and where a non-overlapping clock phase has a rising edge that occurs simultaneously with or after a falling edge of a preceding clock phase, and a falling edge that occurs simultaneously with or before the rising edge of a subsequent clock phase.

13. The CI DAC of claim 1 further comprising:
a plurality of (k) switched capacitor circuit arrays, where each array comprises (n) switched capacitor circuits, where each array accepts (n) consecutive data bits for a corresponding bit position in (n) consecutive k-bit words, where the (n) switched capacitor circuits in each array are sampled with a corresponding phase of an n-phase clock, and where the signal outputs of the switched capacitor circuits in each array are summed at a common corresponding signal output node; and,
a group of (k) type II current conveyors, where the x terminal of each CCII is connected to the common signal output node of a corresponding switched capacitor circuit array, and where z terminals of the CCIIs in the group are summed to a common analog current node.

14. The CI DAC of claim 11 wherein the (n) phases of the clock are selected from a group consisting of overlapping or non-overlapping clock phases, where an overlapping clock phase has a rising edge that occurs before a falling edge of a preceding clock phase, and a falling edge that occurs after the rising edge of a subsequent clock phase, and where a non-overlapping clock phase has a rising edge that occurs simultaneously with or after a falling edge of a preceding clock phase, and a falling edge that occurs simultaneously with or before the rising edge of a subsequent clock phase.

15. The CI DAC of claim 1 further comprising:
a plurality of (m) CI DACs, where the z terminal of each CI DAC has a capacitive output impedance, and where the clock signal input of each CI DAC has a capacitive input impedance;
a signal transmission line having a characteristic impedance with a first terminal connected to a real impedance and a second terminal providing an analog output voltage;
a plurality of (n) clock transmission lines, each clock transmission line having a characteristic impedance with a first end accepting a corresponding phase of an n-phase clock and a second end connected to a real impedance;
wherein the (m) CI DACs are connected to the signal transmission line at (m) locations between the first and second terminals, and the capacitive output impedance of the (m) CI DAC z terminals are absorbed into the characteristic impedance of the signal transmission line; and,
wherein the capacitive input impedance of each CI DAC clock signal input is absorbed into the characteristic impedance of the corresponding clock transmission line.

16. The CI DAC of claim 1 wherein the z terminal of the first CCII supplies a positive component of a pseudo-differential analog current;
the CI DAC further comprising:
a second switched capacitor circuit having inputs to accept a complement of the digital data bit, the first reference voltage, the second reference voltage, and the clock signal, an output connected to the signal ground, and a signal output to supply a current impulse in response to the inputs; and,
a second CCII having an x terminal to accept the current impulse from the second switch capacitor circuit, a y terminal connected to the signal ground, and a z terminal to supply a negative component of the pseudo-differential analog current.

17. A current impulse (CI) method for converting digital data signals to analog values, the method comprising:
accepting a digital data bit;
converting the digital data bit into a current impulse; and,
converting the current impulse into an analog current representing the digital data bit.

18. The method of claim 17 wherein accepting the digital data bit includes accepting a k-bit digital word;
wherein converting the digital data bit into the current impulse includes converting the k-bit digital word into (k) corresponding current impulses; and,
wherein converting the current impulse into the analog current includes converting the (k) current impulses into an analog current representing the k-bit digital word.

19. The method of claim 18 wherein accepting the k-bit digital word includes accepting (n) consecutive k-bit digital words;
wherein converting the k-bit digital word into (k) corresponding current impulses includes, for each bit position in the k-bit digital word, sampling (n) consecutive bits using (n) consecutive phases of an n-phase clock, creating (n) interleaved current impulses; and,
wherein converting the current impulse into the analog current representing the k-bit digital word includes converting the (n) interleaved current impulses into an analog current representing the (n) consecutive k-bit digital words.

20. The method of claim 17 wherein accepting the digital data bit includes accepting a k-bit digital word;
wherein converting the digital data bit into the current impulse includes converting the k-bit digital word into a summed current impulse.

21. The method of claim 20 wherein accepting the k-bit digital word includes accepting (n) consecutive k-bit digital words;
wherein converting the k-bit digital word into a summed current impulses includes, for each bit position in the k-bit digital word, sampling (n) consecutive bits using (n) consecutive phases of an n-phase clock, creating (n) summed current impulses; and,
wherein converting the current impulse into the analog current representing the digital data bit includes converting the (n) summed current impulses into an analog current representing the (n) consecutive digital words.

22. A current impulse (CI) digital-to-analog converter (DAC), the CI DAC comprising:
a switched capacitor circuit having inputs to accept a digital data bit, a first reference voltage, a second reference voltage, and a clock signal, an output connected to a signal ground, and a signal output to supply a current impulse in response to the inputs; and,
a first type II current conveyor (CCII−) comprising:
a field effect transistor (FET) having a gate connected to a bias voltage, a source connected to the signal output of the switched capacitor circuit, and a drain to supply the analog current; and,
a current source having a first terminal connected to the FET source and a second terminal connected to the signal ground.

* * * * *